United States Patent [19]

Jung et al.

[11] Patent Number: 6,160,729
[45] Date of Patent: Dec. 12, 2000

[54] ASSOCIATIVE MEMORY AND METHOD FOR THE OPERATION THEREOF

[75] Inventors: Stefan Jung, Munich; Roland Thewes, Groebenzell; Werner Weber, Munich; Andreas Luck, deceased, late of Munich; by Manfred Luck, heir; by Inge Booken, heir, both of Dortmund, all of Germany

[73] Assignee: Siemens Aktiengesellschaft, Munich, Germany

[21] Appl. No.: 09/162,608

[22] Filed: Sep. 29, 1998

(Under 37 CFR 1.47)

[30] Foreign Application Priority Data

Sep. 29, 1997 [DE] Germany .......................... 197 42 961

[51] Int. Cl.[7] ....................................................... G11C 7/00
[52] U.S. Cl. ........................ 365/49; 365/185.29; 365/218
[58] Field of Search ................................. 365/49, 185.29, 365/218

[56] References Cited

U.S. PATENT DOCUMENTS 5,014,235  5/1991  Morton ........................... 365/185.11 X

FOREIGN PATENT DOCUMENTS 0 516 847 A1  12/1992  European Pat. Off. .

OTHER PUBLICATIONS

Kramer—Array–Based Analog Computation: Principles, Advantages and Limitations—Neural Network Design Group—CR&D—1086–1947/96 1EEE Proceedings of MicroNeuro'96—p. 68–79.

Biological Cybernetics by Springer–Verlag 1980—G. Palm—p. 19–31.

*Primary Examiner*—Do Hyun Yoo
*Attorney, Agent, or Firm*—Hill & Simpson

[57] ABSTRACT

An associative memory contains cells that are formed of a series circuit of an ordinary PMOS transistor with a PMOS transistor with a floating gate. The ordinary PMOS transistor receives of an input vector and the gate of the second PMOS transistor is connected to a learning input. For the associative access, a second vector can be applied to the drain terminal of the second PMOS transistor and, upon readout, the current flow through the respective series circuit is evaluated column-by-column by current evaluator circuits.

5 Claims, 1 Drawing Sheet

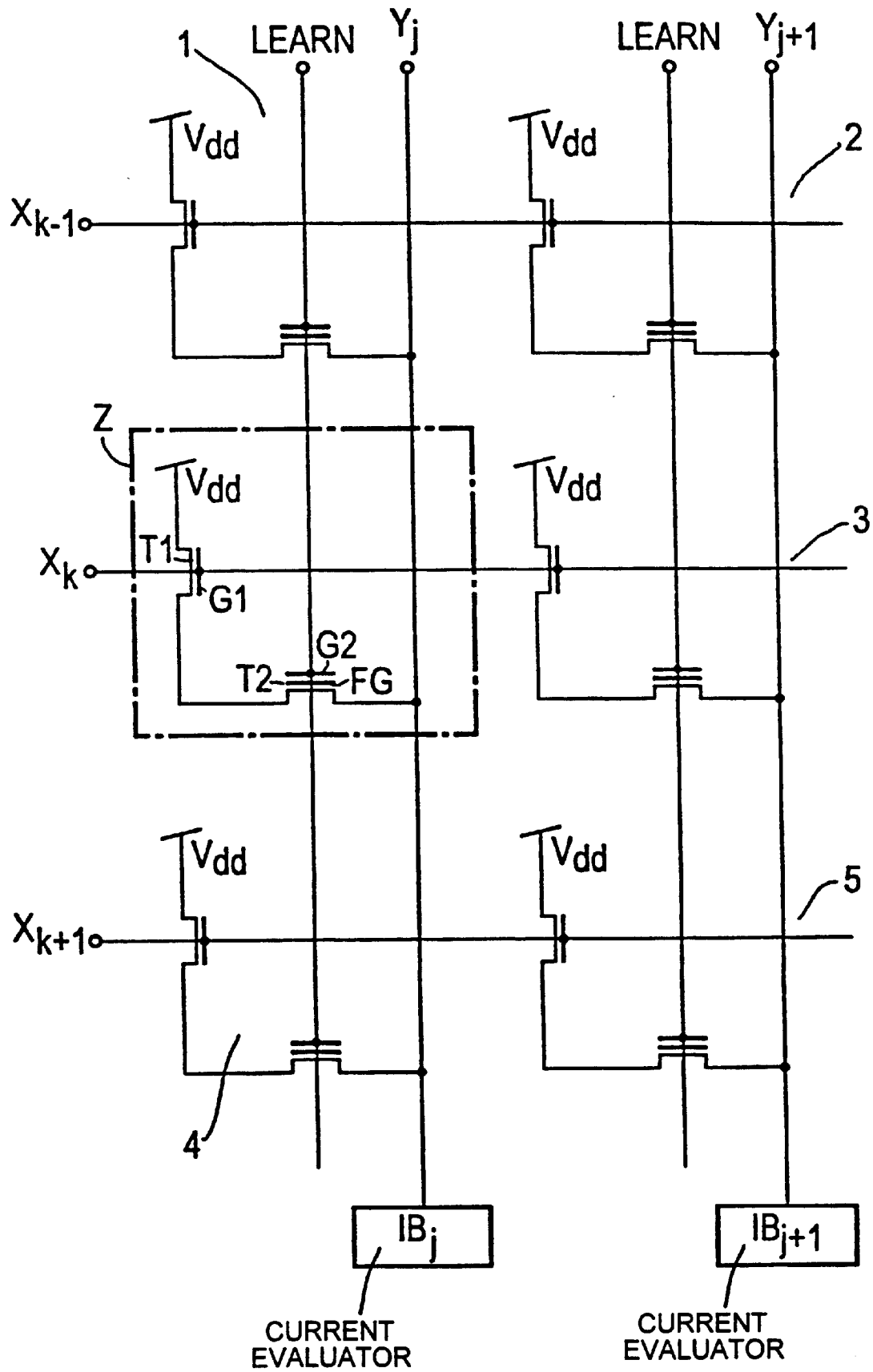

ASSOCIATIVE MEMORY AND METHOD FOR THE OPERATION THEREOF

BACKGROUND OF THE INVENTION

The invention is directed to a neural associative memory which, due to a high degree of parallel processing, has great advantages in specific, fast data-processing systems compared to conventional, comparable systems. Corresponding VLSI circuits having a low area and energy consumption are particularly required in the fast allocation of data as applied to sensor data, for example in image processing or in data processing in intelligent sensors.

Like conventional memories as well, associative memories are composed of a set of memory cells arranged in matrix-shaped fashion which, however, have a certain additional measure of functionality. In previous, trainable neural associative memories, the memory cells always represented a type of processor element or automaton that is respectively composed of a local memory and of a local executive sequencer.

The principle of what is referred to as the "associative matrix" is known from the article by Palm bearing the title, "On Associative Memory" in Biological Cybernetics 36, 1980, pages 19 through 31. What is involved there is a binary memory matrix in which the likewise binary input vectors X are read in, or respectively read out, row-by-row and the output vectors are read in, or respectively read out, column-by-column. The associative storing thus occurs on the basis of a simplified form of what is referred to as Hebb's training rule which, given application of a pattern pair X/Y to be associated with the matrix, locally decides in which way the status is to be modified at every matrix element $m_{ij}$. Specifically, this seems as though the memory matrix is initially occupied entirely with "logical zeroes" in the initial condition. During the training process, $m_{ij}$ then applies for every memory cell, and its condition switches from "logical 0" to "logical 1" exactly when $X_i=Y_j=$"logical 1". When a "logical 1" was already written into the corresponding memory cell, then this status should be retained. Upon read-out of a stored data word, the corresponding input vector X is offered to the matrix and the output quantity Y' is formed in that the activities of the memory cells are added up column-by-column and a threshold decision is applied to this sum. A memory cell is thus considered active when $x_i=m_{ij}=$"1".

Principles, advantages and limits of analog calculating fields are known from the Proceedings of the IEEE Conference MicroNeuro '96, pages 68–79.

SUMMARY OF THE INVENTION

An object underlying the invention is to specify an associative memory and a method for the operation thereof, whereby a cell of the associative memory comprises optimally few components and an integration density can be achieved that comes close to that of conventional read-only memories (EEPROM, EPROM), and that exhibits an optimally low dissipated power.

According to the present invention, an associative memory is provided comprising a plurality of identical memory cells. A respective memory cell is formed only of a series circuit of a regular, first PMOS regular transistor and of a second PMOS regular transistor with a floating gate. A first terminal of the first PMOS transistor is connected to a supply voltage, and for associative storing, a second terminal of the first PMOS transistor is connected via the second PMOS transistor to a respective terminal for a bit signal of an output vector and, for reading, is connected to a current evaluator. In a respective cell, a terminal for a bit signal of a respective input vector is connected to a gate of the respective first PMOS transistor and a terminal for a learning signal is connected to a gate of the second PMOS transistor.

The invention is explained in greater detail below with reference to an exemplary embodiment shown in the drawing.

BRIEF DESCRIPTION OF THE DRAWING

The drawing is a schematic illustration of the associative memory of the present invention.

DESCRIPTION OF THE PREFERRED EMBODIMENTS

A functional integration both of the training as well as of the storing function is achieved by the invention with the assistance of two series-connected PMOS transistors.

By way of example, the drawing shows an excerpt with six identically constructed cells 1 ... 5, Z of an associative memory. The cell Z, for example, respectively comprises a series circuit of a regular PMOS transistor T1 and a PMOS transistor T2 with floating gate FG, whereby the series circuit is connected to the supply voltage $V_{dd}$ via the transistor T1 and is connected via the transistor T2 to a terminal $Y_j$ for the bit signal of an output vector Y and to an input of a current evaluator $1B_j$. The gate G1 of the transistor $T_1$ is connected with a terminal $X_k$ for the bit signal of an input vector X. The gate G2 of the transistor T2 is connected to a terminal LEARN for a learning signal. Immediate neighboring cells 1 and 4 of the memory cell Z are merely connected, instead of to the terminal $X_k$, are connected to terminals $X_{k-1}$ and $X_{k+1}$ for the neighbor bit signals of the input vector, and which, in common with Z, form a first column. The neighbor column is formed of the cells 2, 3 and 5 that are not connected to the terminal $Y_j$ but to the terminal $Y_{j+1}$ for the neighbor bit signal of the output vector and to a further current evaluator $1B_{j+1}$.

A column is formed of a plurality of memory cells wherein drain nodes of transistor T2 are respectively connected to the terminal $Y_j$ via a common drain line. Dependent on the plurality of memory cells conductive in the training phase, a specific current flows in the common drain line. The current evaluators $1B_j$, $1B_{j+1}$, ... connected to the drain lines then respectively determine the number of activated memory cells in a column and implement a threshold decision.

Initialization or Global Erase:

Before the actual training process can begin, the memory matrix must be initialized such that a "logical 0" is written into all memory cells and all transistors with a floating gate become normally-off transistors, whereby "normally-off" means that the transistor inhibits, given a gate-source voltage of 0 volts.

This can be achieved, for example, by the application of UV light onto the manufactured circuit (UV erase), or better, by applying a high positive voltage relative to the substrate (bulk) to all learning inputs LEARN, this leading to a positive charging of the floating gate by Fowler-Nordheim tunnels through the gate oxide.

Associative Storing:

Given a "logical 1", a voltage level of 0 volts, and a "logical 0", a voltage level of $V_{DD}$=+5 volts is present at the terminal $X_k$; and given a "logical 1", a negative potential of, for example $V_{prog}=-V_{DD}=-5$ volts, a "logical 0", a voltage level of $V_{DD}$=+5 volts is present at the terminal $Y_j$, applied, for example, in associative storing. The learning input LEARN is constantly connected to ground for all memory cells. The following table shows an overview of the effects of the various combinations of the input values during the association phase.

| X   | Y   | X        | X        | (LEARN = 0V)                                                                         |
|-----|-----|----------|----------|--------------------------------------------------------------------------------------|
| '0' | '0' | $V_{DD}$ | $V_{DD}$ | T1 inhibits, no current flow                                                         |
| '0' | '1' | $V_{DD}$ | $V_{DD}$ | T1 inhibits, no current flow                                                         |
| '1' | '0' | 0V       | $V_{DD}$ | T1 conducts but Y = $V_{dd}$ = 5V → no current flow                                  |
| '1' | '1' | 0V       | $V_{DD}$ | T1, T2 conduct, HE injection in FG, FG is negatively charged, $U_t$ sinks            |

As one can see, a current flow and, thus, a hot electron programming of the floating gate PMOS transistor by injection of hot electrons (HE injection) into the floating gate occurs only given $X_k$=$I_j$="1" because of the high drain-source voltage. Additional electrons thus proceed onto the floating gate, these causing the threshold voltage of T2 to change in the direction of positive values until T is ultimately a normally-on transistor, whereby "normally-on" means that the transistor is transmissive given a gate-source voltage of 0 volts.

Reading (Retrieval):

For example, the declaration that a "logical 1" at the terminal $X_k$ corresponds to a voltage level of 0 volts and a "logical 0" corresponds to a level of $V_{DD}$ is valid in the retrieval phase. The terminal $Y_j$ is thereby disconnected, or no signal is applied, and the drain node of the transistor T2 serves here as current output of the memory cell Z. The learning input LEARN is constantly connected to $V_{DD}$ for all memory cells. The series circuit of T1 and T2 in this case acts like an AND gate; a current flow occurs only given X="1" and cell status ="1", this current flow being capable of being detected by the current evaluator $Ib_j$, $Ib_{j+1}$. . . connected to the drain node of the transistor T2 via the common drain line because both transistors conduct simultaneously only in this case.

Although various minor modifications might be suggested by those skilled in the art, it should be understood that our wish to embody within the scope of the patent warranted hereon all such modifications as reasonably and properly come with the scope of our contribution to the art.

We claim as our invention:

1. An associative memory, comprising:

a plurality of identical memory cells;

a respective memory cell being formed only of a series circuit of a regular, first PMOS transistor and of a second PMOS transistor with a floating gate, a first terminal of the first PMOS transistor being connected to a supply voltage, and, for associative storing, a second terminal of the first PMOS transistor being connected via the second PMOS transistor to a respective terminal for a bit signal of an output vector and, for reading, being connected to a current evaluator; and in a respective memory cell, a terminal for a bit signal of a respective input vector being connected to a gate of the respective, first PMOS transistor and a terminal for a learning signal being connected to a gate of the second PMOS transistor.

2. The associative memory according to claim 1, wherein the memory cells are arranged matrix-shaped, a respective terminal for a bit signal of the input vector being connected to the memory cells of a common row and a respective terminal for a bit signal of the output vector being connected to cells of a common column.

3. A method for operation of an associative memory, comprising the steps of:

providing a plurality of identical memory cells, a respective memory cell being formed only of a series circuit of a regular, first PMOS transistor and of a second PMOS transistor with a floating gate, a first terminal of the first PMOS transistor being connected to a supply voltage, and for associative storing, a second terminal of the first PMOS transistor being connected with the second PMOS transistor to a respective terminal for a bit signal of an output vector and, for reading, being connected to a current evaluator, and wherein in a respective cell, a terminal for a bit signal of a respective input vector is connected to a gate of the respective, first PMOS transistor and a terminal for a learning signal is connected to a gate of the second PMOS transistor;

providing a global erase by UV light or positive charging of the floating gate with assistance of a high positive voltage compared to a substrate at the terminal for the learning signal, so that all second PMOS transistors become normally-off transistors;

providing an associative storing in a respective cell such that an injection of hot electrons into the floating gate of the respective second PMOS transistor occurs only until the second PMOS transistor becomes a normally-on transistor, when the terminals for the bit signal of the input vector and the bit signal of the output vector are respectively charged with a level for logical 1; and reading the respective cell such that the learning signal receives the supply voltage as a current flows through the respective series circuit and the terminal for the bit signal of the output vector only when a level for a logical 1 is present at the terminal for the respective bit signal of the input vector with the second PMOS transistor being a normally-on transistor, whereby both PMOS transistors are conductive.

4. An associative memory, comprising:

a plurality of memory cells;

the memory cells being formed of a series circuit of a regular, first PMOS transistor and of a second PMOS transistor with a floating gate, a first terminal of the first PMOS transistor being connected to a supply voltage, and, for associative storing, a second terminal of the first PMOS transistor being connected via the second PMOS transistor to a terminal for a bit signal of an output and, for reading, being connected to a current evaluator; and the memory cells having a respective cell, a terminal for a bit signal of a respective input being connected to a gate of the first PMOS transistor and a terminal for a learning signal being connected to a gate of the second PMOS transistor.

5. A method for operation of an associative memory, comprising the steps of:

providing a plurality of identical memory cells, the memory cells being formed of a series circuit of a regular, first PMOS transistor and of a second PMOS transistor with a floating gate, a first terminal of the first PMOS transistor being connected to a supply voltage, and for associative storing, a second terminal of the first PMOS transistor being connected with the second PMOS transistor to a respective terminal for a bit signal of an output and, for reading, being connected to a current evaluator, a terminal for a bit signal of a respective input being connected to a gate of the first PMOS transistor and a terminal for a learning signal being connected to a gate of the second PMOS transistor;

providing a global erase by UV light or positive charging of the floating gate with assistance of a high positive voltage compared to a substrate at the terminal for the learning signal, so that all second PMOS transistors become normally-off transistors;

providing an associative storing in a respective cell such that an injection of hot electrons into the floating gate of the respective second PMOS transistor occurs only until the second PMOS transistor becomes a normally-on transistor, when the terminals for the bit signal of the input and the bit signal of the output are respectively charged with a level for logical 1; and providing the reading of the respective cell such that the learning signal receives the supply voltage as a current flows through the respective series circuit and the terminal for the bit signal of the output only when a level for a logical 1 is present at the terminal for the respective bit signal of the input with the second PMOS transistor being a normally-on transistor, whereby both PMOS transistors are conductive.

\* \* \* \* \*